US010204875B2

(12) United States Patent
Kay et al.

(10) Patent No.: US 10,204,875 B2
(45) Date of Patent: Feb. 12, 2019

(54) SYSTEMS AND METHODS FOR INHIBITING BACKEND ACCESS TO INTEGRATED CIRCUITS BY INTEGRATING PHOTON AND ELECTRON SENSING LATCH-UP CIRCUITS

(71) Applicant: The United States of America, as represented by the Secretary of the Navy, Washington, DC (US)

(72) Inventors: Matthew Kay, Jasper, IN (US); Matthew Gadlage, Bloomington, IN (US); Adam Duncan, Bloomington, IN (US); Brett Hamilton, Heltonville, IN (US); Brett Werner, Jasper, IN (US); Austin Roach, Bloomfield, IN (US)

(73) Assignee: The United States of America, as represented by the Secretary of the Navy, Washington, DC (US)

( * ) Notice: Subject to any disclaimer, the term of this patent is extended or adjusted under 35 U.S.C. 154(b) by 0 days.

(21) Appl. No.: 15/951,576

(22) Filed: Apr. 12, 2018

(65) Prior Publication Data
US 2018/0301427 A1 Oct. 18, 2018

Related U.S. Application Data

(60) Provisional application No. 62/484,528, filed on Apr. 12, 2017.

(51) Int. Cl.
*H03K 19/00* (2006.01)
*H01L 23/00* (2006.01)

(52) U.S. Cl.
CPC .................. *H01L 23/576* (2013.01)

(58) Field of Classification Search
CPC ...................................... H01L 23/576
USPC .............................................. 326/8
See application file for complete search history.

(56) References Cited

U.S. PATENT DOCUMENTS

| | | | | |
|---|---|---|---|---|
| 5,736,777 A | * | 4/1998 | Shield | H01L 23/576 257/379 |
| 8,154,942 B1 | * | 4/2012 | Xiao | G11C 17/18 327/525 |
| 2009/0070887 A1 | * | 3/2009 | Knowles | H01L 23/576 726/34 |
| 2011/0210782 A1 | * | 9/2011 | Kuenemund | G06F 21/81 327/493 |
| 2011/0234307 A1 | * | 9/2011 | Marinet | G06F 21/72 327/538 |
| 2012/0274350 A1 | * | 11/2012 | Reese | G06F 21/6209 326/8 |
| 2013/0193437 A1 | * | 8/2013 | Lisart | H01L 23/57 257/48 |
| 2018/0005703 A1 | * | 1/2018 | Chung | H01L 45/06 |

* cited by examiner

*Primary Examiner* — Don Le
(74) *Attorney, Agent, or Firm* — Christopher A. Monsey

(57) ABSTRACT

Exemplary systems and methods for inhibiting backend access to an integrated circuit are provided including latch-up circuits triggered by photons, electrons, and ions to create catastrophic failures in integrated circuits. Exemplary systems include latch-up circuits with floating gate bit cells which, when triggered, close the latch-up circuits so that the latch-up circuits can amplify current in a positive feedback loop to create a short circuit to inhibit unauthorized individuals from probing or modifying an integrated circuit.

9 Claims, 9 Drawing Sheets

SYSTEMS AND METHODS FOR INHIBITING BACKEND ACCESS TO INTEGRATED CIRCUITS BY INTEGRATING PHOTON AND ELECTRON SENSING LATCH-UP CIRCUITS

This U S. Non-Provisional patent application, claims priority to U.S. Provisional Patent Application Ser. No. 62/484,528, filed Apr. 12, 2017, titled SYSTEMS AND METHODS FOR PREVENTING BACKEND ACCESS TO INTEGRATED CIRCUITS BY INTEGRATING PHOTON AND ELECTRON SENSING LATCH-UP CIRCUITS INTO INTEGRATED CIRCUITS TO CAUSE A CATASTROPHIC LATCH-UP CONDITION WHEN THE INTEGRATED CIRCUITS ARE POWERED, the disclosures of which are expressly incorporated by reference herein.

STATEMENT REGARDING FEDERALLY SPONSORED RESEARCH OR DEVELOPMENT

The invention described herein was made in the performance of official duties by employees of the Department of the Navy and may be manufactured, used and licensed by or for the United States Government for any governmental purpose without payment of any royalties thereon. This invention (Navy Case 200,421) is assigned to the United States Government and is available for licensing for commercial purposes. Licensing and technical inquiries may be directed to the Technology Transfer Office, Naval Surface Warfare Center Crane, email: Cran_CTO@navy.mil.

BACKGROUND AND SUMMARY OF THE INVENTION

The present invention relates to a systems and methods for inhibiting backend access to integrated circuits (ICs) by integrating photon and electron sensing latch-up circuits (LCs) into integrated circuits to cause a catastrophic latch-up condition when the integrated circuits are powered.

In modern computing, ICs play an ever-increasing role in creating advanced hardware components. Two common problems encountered in the computing industry are unauthorized modifications to ICs and piracy of proprietary designs and information. Both of these problems can occur when competitors and other individuals have backend access to an IC. For piracy, individuals can inspect and probe an IC to determine the functionality of individual circuits and components. With backend access, an individual can copy proprietary information with ease. For unauthorized modifications, individuals with backend access can make changes to an integrated circuit with a variety of techniques (e.g., a focused ion beam (FIB)). Modifications can include attempts to change the functionality of an IC beyond the manufacturer's intended purpose (e.g., repurpose an IC to function in a competing product) or attempts to subvert the proper functionality of an IC while hiding evidence that the modifications occurred (e.g. diminish the effectiveness of a system).

To solve these problems, embodiments of this invention disclose incorporating LCs into an integrated circuit so that unauthorized backend access triggers a binary trip sensor (e.g., a floating gate bit cell) to activate LCs when particular conditions are met. An excess number of electrons placed on a floating gate bit cell can create a negative channel bias, which places a floating gate bit cell in an "off" state such that a LC will not activate when a connected IC is powered. Triggering a floating gate bit cell causes a connected LC to close. Closing the LC results in a positive feedback loop which will short-circuit the integrated circuit. A short-circuit will restrict unauthorized individuals from being able to effectively modify or probe the integrated circuit by rendering the circuit inoperable.

According to an illustrative embodiment of the present disclosure, at least one LC is connected to an IC. The LC can include a charged floating gate. A floating gate can lose its charge when exposed to photons, electrons, or ions. Ions (e.g. gallium ions, helium ions) can be used in a focused ion beam (FIB) to modify an IC. The ions in a FIB will trigger a floating gate bit cell, so attempts to modify an IC with a FIB can activate a LC and cause latch-up events to occur.

According to a further illustrative embodiment of the present disclosure, at least one LC is connected to an IC. The LC can include a photodiode connected to a charged floating gate. When the photodiode receives light, the photodiode causes the floating gate to lose its charge and close the circuit, which closes the LC and causes short-circuits if the IC is powered.

Additional features and advantages of the present invention will become apparent to those skilled in the art upon consideration of the following detailed description of the illustrative embodiment exemplifying the best mode of carrying out the invention as presently perceived.

BRIEF DESCRIPTION OF THE DRAWINGS

The detailed description of the drawings particularly refers to the accompanying figures in which.

DETAILED DESCRIPTION OF THE DRAWINGS

The embodiments of the invention described herein are not intended to be exhaustive or to limit the invention to precise forms disclosed. Rather, the embodiments selected for description have been chosen to enable one skilled in the art to practice the invention.

Figure 1:
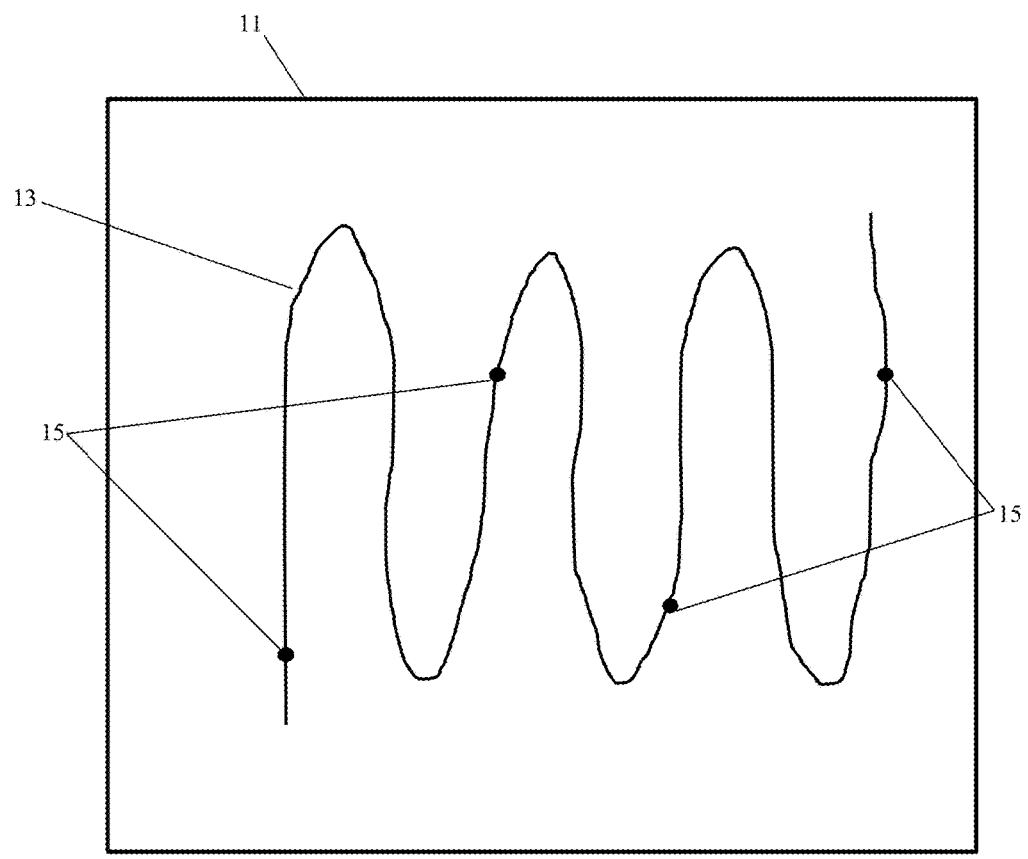
FIG. 1 is a circuit with LCs incorporated into an integrated circuit.

Referring initially to FIG. 1, a circuit board 11 with an IC 13 and LCs 15 connected to the IC 13 at various locations. In exemplary embodiments, at least one LC 15 is connected to an IC 13. An LC 15 can be connected to an IC 13 at locations to limit access to the LC 15 (e.g., near the center of an IC 13, near other components). In exemplary embodiments, multiple LCs 15 can be connected to an IC 13 in configurations designed to further limit access to LCs if unauthorized individuals attempt to probe or modify an IC 13 (e.g. placing LCs surrounding important components to inhibit a FIB from making modifications without triggering an LC). In some embodiments, an IC 13 can be placed in a protective casing (e.g. a computer tower) made of materials which absorb photons, electrons, or ions (e.g. metallic cases, composite materials including high atomic number layers) to inhibit accidental activation of LCs 15.

Figure 2:
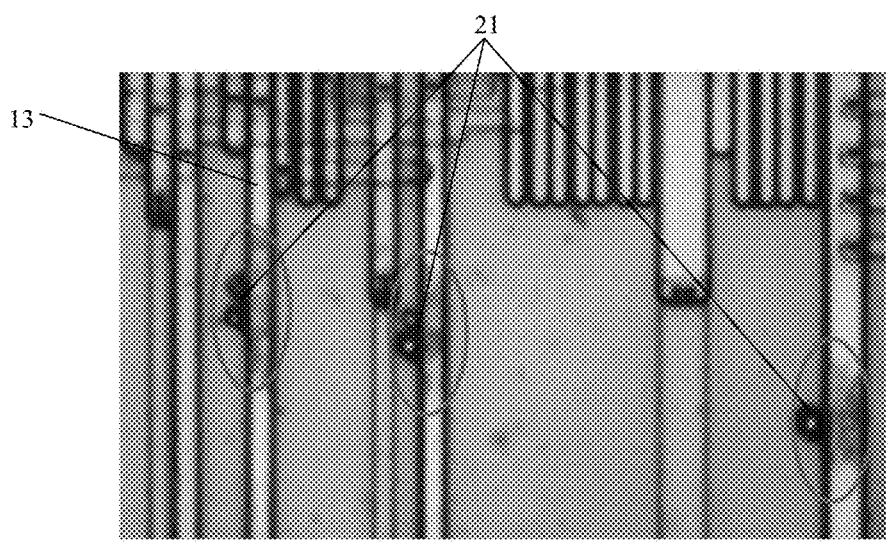
FIG. 2 is a circuit with molten metal traces from a latch-up event on an integrated circuit.

FIG. 2 shows an exemplary IC 13 after a latch-up event has occurred. In an exemplary system, closing an LC (not shown) can cause a positive feedback loop that can end in catastrophic failure of a connected circuit (e.g., a short circuit). A positive feedback loop can cause the power in an LC to rise and create heat until components of an IC 13 begin to melt and leave molten metal traces 21 on an IC 13.

Figure 3:
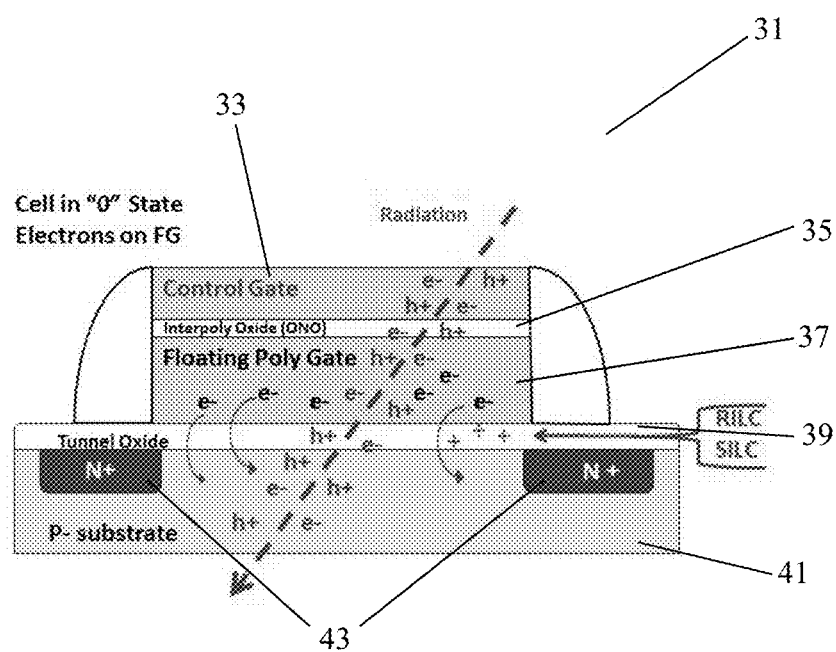
FIG. 3 is an exemplary floating gate bit cell.

FIG. 3 shows an exemplary floating gate bit cell 31. A control gate 33 is attached to a first electrical isolation layer 35 (e.g. interpoly oxide), which is attached to a floating gate 37, and the floating gate 37 is attached to a second electrical isolation layer 39. An excessive amount of electrons can be placed on a floating gate 37 during a write or program operation to create a negative channel bias, which puts the floating gate bit cell 31 in an "off" or open state. A first and second electrical isolation layers inhibit electrons from exiting a floating gate 37 through a connected circuit. Electrons on a floating gate 37 can be ejected when incident radiation (e.g. photons, electrons) or ions with sufficiently large energy interacts with the electrons. In addition, sufficiently large heat sources (e.g., a soldering iron) can also eject electrons from a floating gate 37. When a floating gate 37 loses its charge, the floating gate bit cell 31 enters an "on" or closed state. A control gate 35 acts as the switch for the floating gate bit cell 31. A p-substrate 41 and wells 43 provide a channel for current to enter and exit the floating gate bit cell 31. Electrons on a floating gate 37 can be naturally ejected through stress induced leakage current (SILC) or radiation induced leakage current (RILC). To inhibit SILC and RILC from triggering a floating gate bit cell 31, more charge can be placed on a floating gate 37 so that a greater number of electrons must be drained to trigger the floating gate bit cell 31. The number of electrons can be adjusted such that accidental triggering is unlikely to occur (e.g., an average time of several years before failure under average amounts of SILC and RILC) while still being sensitive to backend access attempts.

Figure 4:
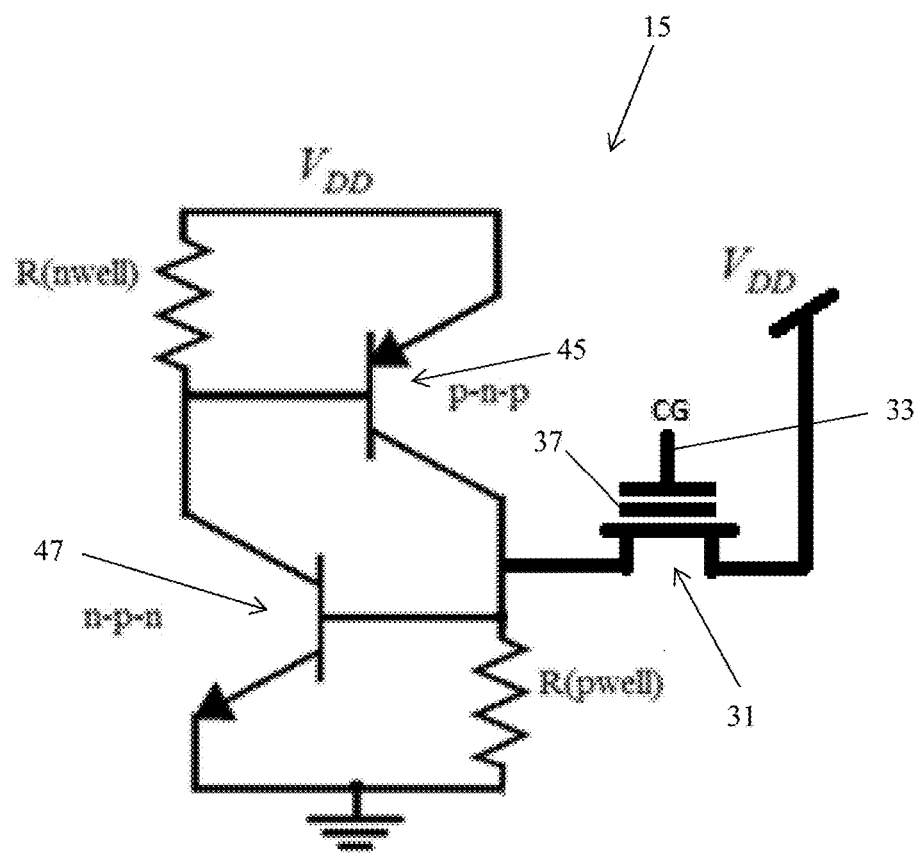
FIG. 4 is an equivalent circuit of an exemplary LC.

FIG. 4 shows an equivalent circuit of an exemplary LC 15. A Positive-Negative-Positive (PNP) bipolar junction transistor (BJT) 45 and a Negative-Positive-Negative (NPN) BJT 47 form a loop which continually amplifies current to create a positive feedback loop when powered. A floating gate bit cell 31 acts as an open circuit when charged which inhibits the LC 15 from activating. When a floating gate 37 loses its charge, an LC 15 closes and the resulting feedback loop causes a short circuit.

Figure 5:
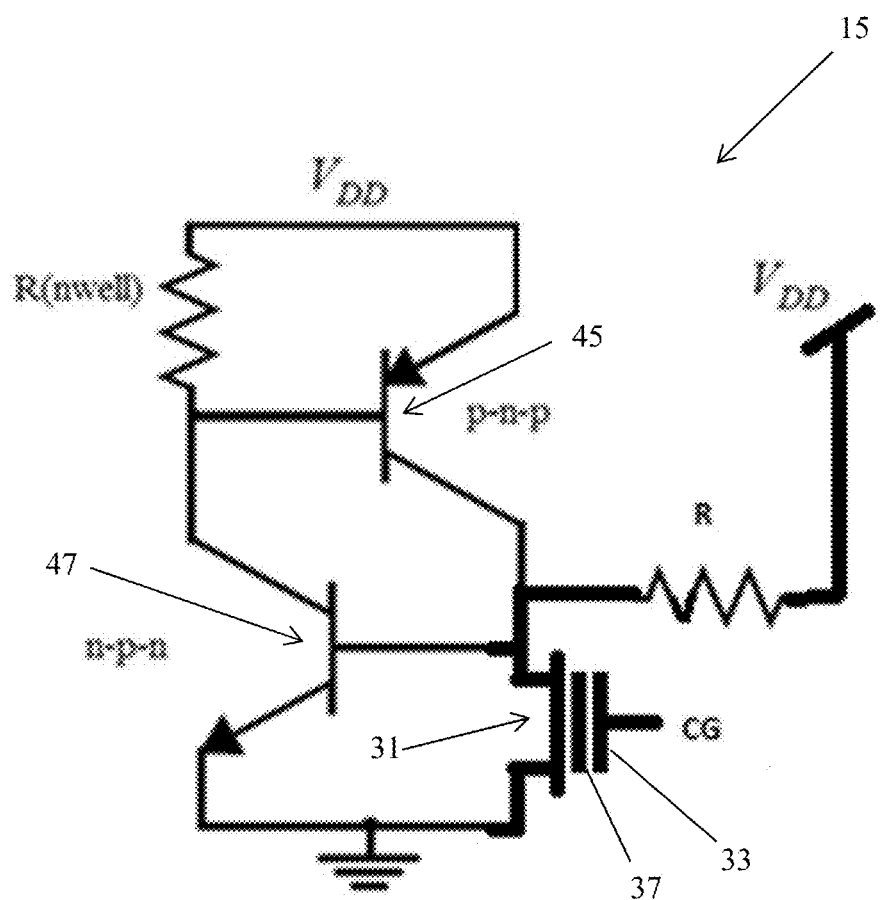
FIG. 5 is an equivalent circuit of another exemplary LC.

FIG. 5 shows an equivalent circuit of another exemplary LC 15 with an alternative placement of a floating gate bit cell 31. A PNP BJT 45 and a NPN BJT 47 form a loop which continually amplifies current to create a positive feedback loop when powered. A floating gate bit cell 31 acts as an open circuit when charged which inhibits the LC 15 from activating. When a floating gate 37 loses its charge, an LC 15 closes and the resulting feedback loop causes a short circuit.

Figure 6:
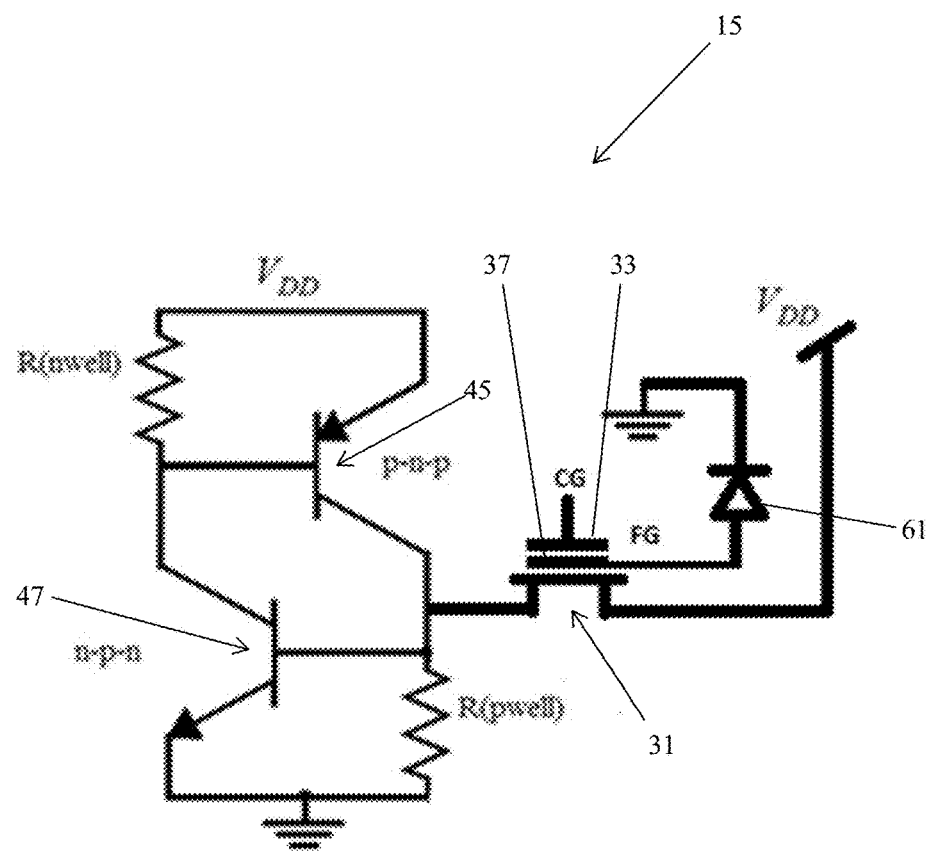
FIG. 6 is an equivalent circuit of an exemplary LC with a photodiode connected to a floating gate bit cell.

FIG. 6 shows an equivalent circuit of an exemplary LC 15 with a photodiode 61 connected to a floating gate 37. A PNP BJT 45 and a NPN BJT 47 form a loop which continually amplifies current to create a positive feedback loop when powered. A floating gate bit cell 31 acts as an open circuit when charged which inhibits the LC 15 from activating. When a floating gate 37 loses its charge, an LC 15 closes and the resulting feedback loop causes a short circuit. Photons interacting with electrons in a floating gate 37 may not have enough energy to eject the electrons from the floating gate 37, so a photodiode 61 can be connected to the floating gate 37 such that activating the photodiode 61 will cause a grounded circuit to close and drain electrons from the floating gate 37. A photodiode 61 can be configured to activate when detecting at least one wavelength of light at one or more wavelengths. For example, a photodiode 61 with a reverse bias can be used such that the photodiode 61 acts as an open circuit until photons activate the photodiode 61 and close the circuit.

Figure 7:
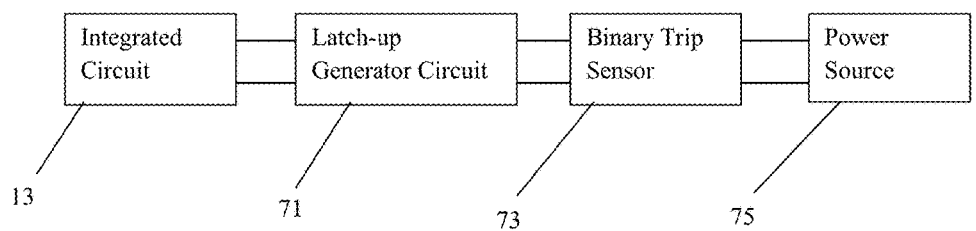
FIG. 7 is a block diagram showing the basic component structures of an exemplary LC.

FIG. 7 shows a block diagram of the basic components of an exemplary LC system with an exemplary LC 15 incorporated (e.g., as shown in FIG. 4). An IC 13 is connected in loop to a latch-up generator circuit (LGC) 71. A binary trip sensor 73 (e.g., a floating gate bit cell, or a radiation sensitive MOS transistor) is connected to a LGC 71. A power source 75 is connected to a binary trip sensor 73. In other embodiments, the components can have other configurations. For example, a binary trip sensor 73 can be connected to an LGC 71 without being directly connected to a power source 75 (e.g., as shown in FIG. 5).

Figure 8:
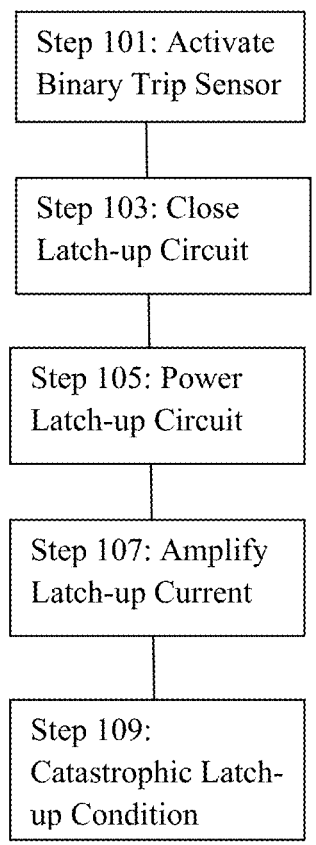
FIG. 8 is a flow diagram of an exemplary latch-up process.

FIG. 8 shows a flow diagram of an exemplary latch-up activation. At step 101, a binary trip sensor is activated (e.g. incident electrons remove electrons from a floating gate bit cell, or photons activate a photodiode). At step 103, a latch-up generator circuit closes because of an activated binary trip sensor. At step 105, a closed LC is powered (e.g. the integrated circuit is powered), allowing current to flow through the LC. At step 107, a closed and powered LC amplifies current in a positive feedback loop. At step 109, amplified current causes a catastrophic latch-up condition in an IC (e.g. a short circuit). In other embodiments, certain steps can be performed in alternate orders. For example, step 105 can be done before step 101.

Figure 9:
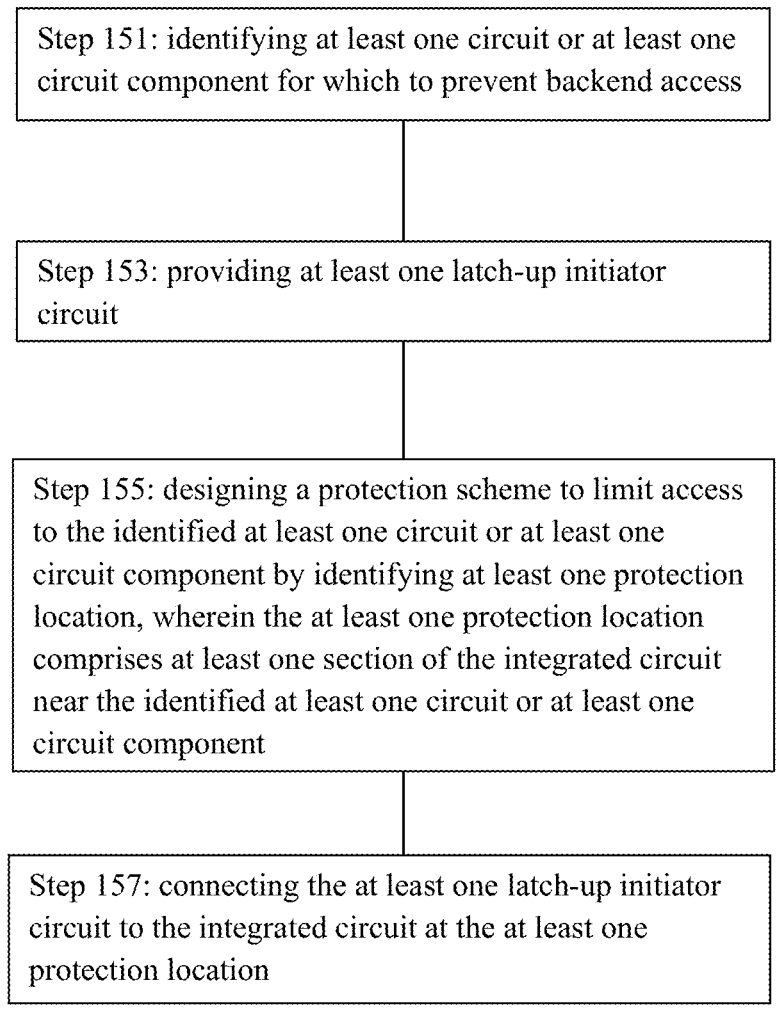
FIG. 9 is an exemplary method of using an exemplary LC to restrict backend access.

FIG. 9 shows an exemplary method of inhibiting backend access to an integrated circuit. At step 151, at least one circuit or at least one circuit component is identified for which backend access is to be inhibited. At step 153, at least one latch-up initiator circuit (e.g., that shown in FIGS. 4-6) is provided. At step 155, a protection scheme is designed to limit access to the identified at least one circuit or at least one circuit component by identifying at least one protection location, wherein the at least one protection location includes at least one section of the integrated circuit near the previously identified at least one circuit or at least one circuit component. At step 157, the at least one latch-up initiator circuit is connected to the integrated circuit at the at least one protection location such that attempts to probe or modify the integrated circuit will trigger at least one latch-up initiator circuit and cause a catastrophic failure (e.g., short circuit) when the integrated circuit is powered.

Although the invention has been described in detail with reference to certain preferred embodiments, variations and modifications exist within the spirit and scope of the invention as described and defined in the following claims.

The invention claimed is:

1. A backend access inhibitor system comprising:
   an integrated circuit comprising:
   at least one latch-up initiator circuit, each latch-up initiator circuit comprising:
   a latch-up generator circuit configured to amplify a current until a short circuit occurs in the integrated circuit when the latch-up generator circuit is closed and powered;
   a floating gate transistor comprising a floating gate, a control gate, a body substrate, a drain node, and a source node, wherein the floating gate transistor is electrically coupled to the latch-up generator circuit, wherein a first predetermined number of electrons are placed on the floating gate prior to operating the integrated circuit, wherein the floating gate transistor is in an off state when at least a second predetermined number of electrons are on the floating gate transistor and an on state when below the second predetermined number of electrons, wherein the first predetermined number of electrons exceeds the second predetermined number of electrons;

wherein the floating gate transistor is configured to close the latch-up generator circuit when the floating gate transistor is in an on state.

2. The system of claim 1, further comprising a casing comprising an electron and photon absorbing material, wherein the casing surrounds the integrated circuit.

3. The system of claim 1, said latch-up initiator circuit further comprising a power source configured to provide power to the latch-up generator circuit when the latch-up generator circuit is closed and the integrated circuit is powered.

4. The system of claim 1, said latch-up initiator circuit further comprising a photodiode electrically coupled to the floating gate transistor, wherein photons of at least one predetermined wavelength of light will activate the photodiode, wherein activating the photodiode will drain electrons from the floating gate.

5. A method of inhibiting backend access to an integrated circuit comprising:
    identifying at least one circuit component of the integrated circuit for which to inhibit backend access;
    providing at least one latch-up initiator circuit, each latch-up initiator circuit comprising:
        a latch-up generator circuit configured to amplify a current until a short circuit occurs in the integrated circuit when the latch-up generator circuit is closed and powered;
        a floating gate transistor comprising a floating gate, a control gate, a body substrate, a drain node, and a source node, wherein the floating gate transistor is electrically coupled to the latch-up generator circuit, wherein a first predetermined number of electrons are placed on the floating gate prior to operating the integrated circuit, wherein the floating gate transistor is in an off state when at least a second predetermined number of electrons are on the floating gate transistor and an on state when below the second predetermined number of electrons, wherein the first predetermined number of electrons exceeds the second predetermined number of electrons;
        wherein the floating gate transistor is configured to close the latch-up generator circuit when the floating gate transistor is in an on state;
    designing a protection scheme to limit access to the identified at least one circuit component by identifying at least one protection location, wherein the at least one protection location comprises at least one section of the integrated circuit near the identified at least one circuit component;
    electrically coupling the at least one latch-up initiator circuit to the integrated circuit at the at least one protection location.

6. The method of claim 5, said latch-up initiator circuit further comprising a power source configured to provide power to the latch-up generator circuit when the latch-up generator circuit is closed and the integrated circuit is powered.

7. The method of claim 5, said latch-up initiator circuit further comprising a photodiode electrically coupled to the floating gate transistor, wherein photons of at least one predetermined wavelength of light will activate the photodiode, wherein activating the photodiode will drain electrons from the floating gate.

8. The method of claim 5, further comprising:
    providing a casing comprising an electron and photon absorbing material;
    inserting the integrated circuit into the casing such that the casing surrounds the integrated circuit.

9. A method of inhibiting backend access to an integrated circuit comprising:
    identifying at least one circuit component of the integrated circuit for which to inhibit backend access;
    providing at least one latch-up initiator circuit, each latch-up initiator circuit comprising:
        a latch-up generator circuit configured to amplify a current until a short circuit occurs in the integrated circuit when the latch-up generator circuit is closed and powered;
        a floating gate transistor comprising a floating gate, a control gate, a body substrate, a drain node, and a source node, wherein the floating gate transistor is electrically coupled to the latch-up generator circuit, wherein a first predetermined number of electrons are placed on the floating gate prior to operating the integrated circuit, wherein the floating gate transistor is in an off state when at least a second predetermined number of electrons are on the floating gate transistor and an on state when below the second predetermined number of electrons, wherein the first predetermined number of electrons exceeds the second predetermined number of electrons;
        a photodiode electrically coupled to the floating gate transistor, wherein photons of at least one predetermined wavelength of light will activate the photodiode, wherein activating the photodiode will drain electrons from the floating gate; and
        a power source configured to provide power to the latch-up generator circuit when the latch-up generator circuit is closed and the integrated circuit is powered;
    wherein the floating gate transistor is configured to close the latch-up generator circuit when the floating gate transistor is in an on state;
    providing a casing comprising an electron and photon absorbing material;
    designing a protection scheme to limit access to the identified at least one circuit component by identifying at least one protection location, wherein the at least one protection location comprises at least one section of the integrated circuit near the identified at least one circuit component;
    electrically coupling the at least one latch-up initiator circuit to the integrated circuit at the at least one protection location
    inserting the integrated circuit into the casing such that the casing surrounds the integrated circuit.

* * * * *